United States Patent
Kim

(10) Patent No.: US 12,035,557 B2
(45) Date of Patent: Jul. 9, 2024

(54) DISPLAY DEVICE FOR PREVENTING UN-CURING OF MICRO SEAL

(71) Applicant: LG Display Co., Ltd., Seoul (KR)

(72) Inventor: MinSeok Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 428 days.

(21) Appl. No.: 17/395,346

(22) Filed: Aug. 5, 2021

(65) Prior Publication Data

US 2022/0069249 A1   Mar. 3, 2022

(30) Foreign Application Priority Data

Sep. 3, 2020   (KR) .................. 10-2020-0112408

(51) Int. Cl.
*H10K 50/84* (2023.01)
*H10K 59/122* (2023.01)
*H10K 102/00* (2023.01)

(52) U.S. Cl.
CPC ......... *H10K 50/841* (2023.02); *H10K 50/846* (2023.02); *H10K 59/122* (2023.02); *H10K 2102/311* (2023.02)

(58) Field of Classification Search
CPC ............... H10K 50/841; H10K 59/122; H10K 2102/311

USPC .......................................................... 257/40
See application file for complete search history.

(56) References Cited

U.S. PATENT DOCUMENTS

| 2020/0006697 | A1 | 1/2020 | Jung | |
| 2020/0203642 | A1* | 6/2020 | Kim | ..................... B32B 15/043 |
| 2021/0167323 | A1 | 6/2021 | Jung | |

FOREIGN PATENT DOCUMENTS

| KR | 10-2018-0025018 A | 3/2018 |
| KR | 10-2019-0030951 A | 3/2019 |
| KR | 10-2020-0003337 A | 1/2020 |

* cited by examiner

*Primary Examiner* — Xia L Cross
(74) *Attorney, Agent, or Firm* — Fenwick & West LLP

(57) ABSTRACT

According to an exemplary embodiment of the present disclosure, a display device includes a display panel having a substrate, a back cover which supports the display panel on one surface of the display panel, a flexible film which is electrically connected to a pad unit of the display panel, a sealing layer which covers one ends of the pad unit and the flexible film and a dam which is disposed at an end of the display panel in which the flexible film is located and is in contact with a rear surface of the flexible film. Therefore, according to the present disclosure, the overflowing of the conductive adhesive layer at the end of the substrate is suppressed and the un-curing of the micro seal is suppressed to suppress the curling of the polyimide substrate and the tearing of the flexible film.

19 Claims, 13 Drawing Sheets

DISPLAY DEVICE FOR PREVENTING UN-CURING OF MICRO SEAL

CROSS-REFERENCE TO RELATED APPLICATIONS

This application claims the priority of Republic of Korea Patent Application No. 10-2020-0112408 filed on Sep. 3, 2020, in the Korean Intellectual Property Office, the disclosure of which is hereby incorporated by reference in its entirety.

BACKGROUND

Field

The present disclosure relates to a display device, and more particularly, to a rollable display device which is capable of displaying images even in a rolled state.

Description of the Related Art

As display devices which are used for a monitor of a computer, a television, or a cellular phone, there are an organic light emitting display device (OLED) which is a self-emitting device, a liquid crystal display device (LCD) which requires a separate light source, and the like.

An applicable range of the display device is diversified to personal digital assistants as well as monitors of computers and televisions and a display device with a large display area and a reduced volume and weight is being studied.

Further, recently, a rollable display device which is manufactured by forming a display element, a wiring line, and the like on a flexible substrate such as plastic which is a flexible material so as to be capable of displaying images even though the display device is rolled is getting attention as a next generation display device.

SUMMARY

An object to be achieved by the present disclosure is to provide a display device which suppresses overflowing of a conductive adhesive layer at an end of a substrate.

Another object to be achieved by the present disclosure is to provide a display device which suppresses un-curing of a micro seal.

Objects of the present disclosure are not limited to the above-mentioned objects, and other objects, which are not mentioned above, can be clearly understood by those skilled in the art from the following descriptions.

In order to achieve the above-described object, according to an aspect of the present disclosure, a display device includes a display panel having a substrate, a back cover which supports the display panel on one surface of the display panel, a flexible film which is electrically connected to a pad unit of the display panel, a sealing layer which covers one ends of the pad unit and the flexible film and a dam which is disposed at an end of the display panel in which the flexible film is located and is in contact with a rear surface of the flexible film.

Other detailed matters of the exemplary embodiments are included in the detailed description and the drawings.

According to the present disclosure, the overflowing of the conductive adhesive layer at the end of the substrate is suppressed and the un-curing of the micro seal is suppressed to suppress the curling of the polyimide substrate and the tearing of the flexible film.

By doing this, a driving failure and a reliability issue of the display panel may be solved.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
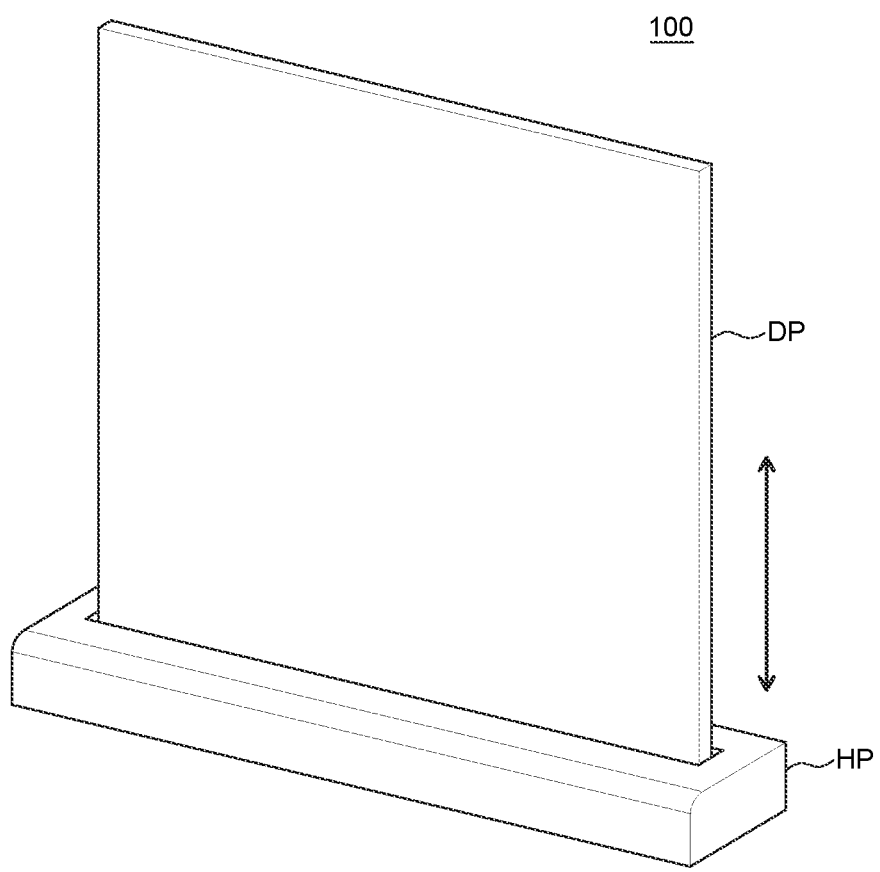
FIGS. 1A and 1B are perspective views of a display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

A rollable display apparatus may also be referred to as a display apparatus which is capable of displaying images even though the display apparatus is rolled. The rollable display apparatus may have a high flexibility as compared with a general display apparatus of the related art. Depending on whether to use a rollable display apparatus, a shape of the rollable display apparatus may freely vary. Specifically, when the rollable display apparatus is not used, the rollable display apparatus is rolled to be stored with a reduced volume. In contrast, when the rollable display apparatus is used, the rolled rollable display apparatus is unrolled to be used.

Figure 1B:
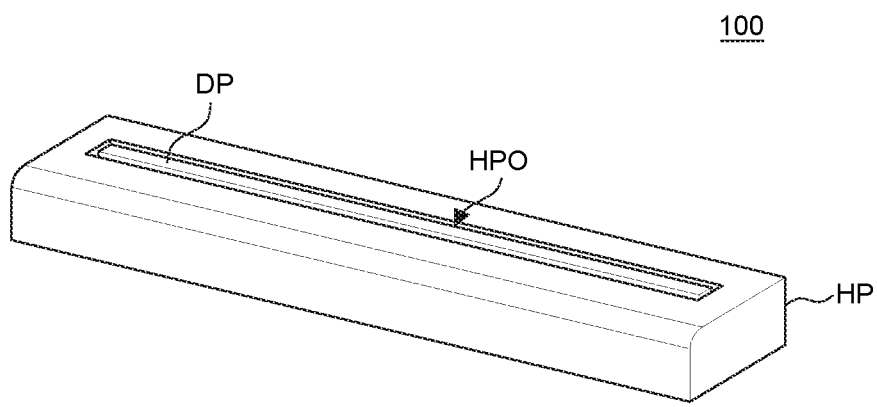

FIGS. 1A and 1B are perspective views of a display device according to a first exemplary embodiment of the present disclosure. Referring to FIGS. 1A and 1B, a display device 100 according to a first exemplary embodiment of the present disclosure includes a display unit DP and a housing unit HP.

The display unit DP is a configuration for displaying images to a user and for example, in the display unit DP, a display element and a circuit, a wiring line, a component, and the like for driving the display element may be disposed.

Since the display device 100 according to the first exemplary embodiment of the present disclosure is a rollable display device, the display unit DP may be configured to be wound or unwound. The display unit DP may be configured by a display panel and a back cover which have a flexibility to be wound or unwound. The display unit DP will be described below in more detail with reference to FIGS. 4 to 8.

The housing unit HP is a case in which the display unit DP is accommodated. The display unit DP may be wound to be accommodated in the housing unit HP and the display unit DP may be unwound to be disposed at the outside of the housing unit HP.

The housing unit HP has an opening HPO through which the display unit DP moves to the inside and the outside of the housing unit HP. The display unit DP may move in a vertical direction by passing through the opening HPO of the housing unit HP.

In the meantime, the display unit DP may be switched from a fully unwound state to a fully wound state or from a fully wound state to a fully unwound state.

FIG. 1A illustrates a fully unwound state of the display unit DP of the display device 100 and the fully unwound display unit DP of the display device 100 is disposed at the outside of the housing unit HP. That is, in order for a user to watch images through the display device 100, when the display unit DP is unwound to be disposed at the outside of the housing unit HP as much as possible and cannot be further unwound any more, it may be defined as a fully unwound state.

FIG. 1B illustrates a fully wound state of the display unit DP of the display device 100 and the fully wound display unit DP of the display device 100 is accommodated in the housing unit HP and cannot be further wound. That is, when the user does not watch the images through the display device 100, it is advantageous from the viewpoint of an external appearance that the display unit DP is not disposed at the outside of the housing unit HP. Therefore, when the display unit DP is wound to be accommodated in the housing unit HP, it is defined as a fully wound state. Further, when the display unit DP is in a fully wound state to be accommodated in the housing unit HP, a volume of the display device 100 is reduced so that the display device 100 may be easily carried.

In the meantime, in order to switch the display unit DP to a fully unwound state or a fully wound state, a driving unit which winds or unwinds the display unit DP may be disposed.

Even though not illustrated in the drawing, the driving unit may include a roller unit which winds or unwinds the display unit DP and a lifting unit which moves the display unit DP in the vertical direction in accordance with the driving of the roller unit.

The roller unit rotates in a clockwise direction or a counterclockwise direction to wind or unwind the display unit DP fixed to the roller unit.

Figure 2:
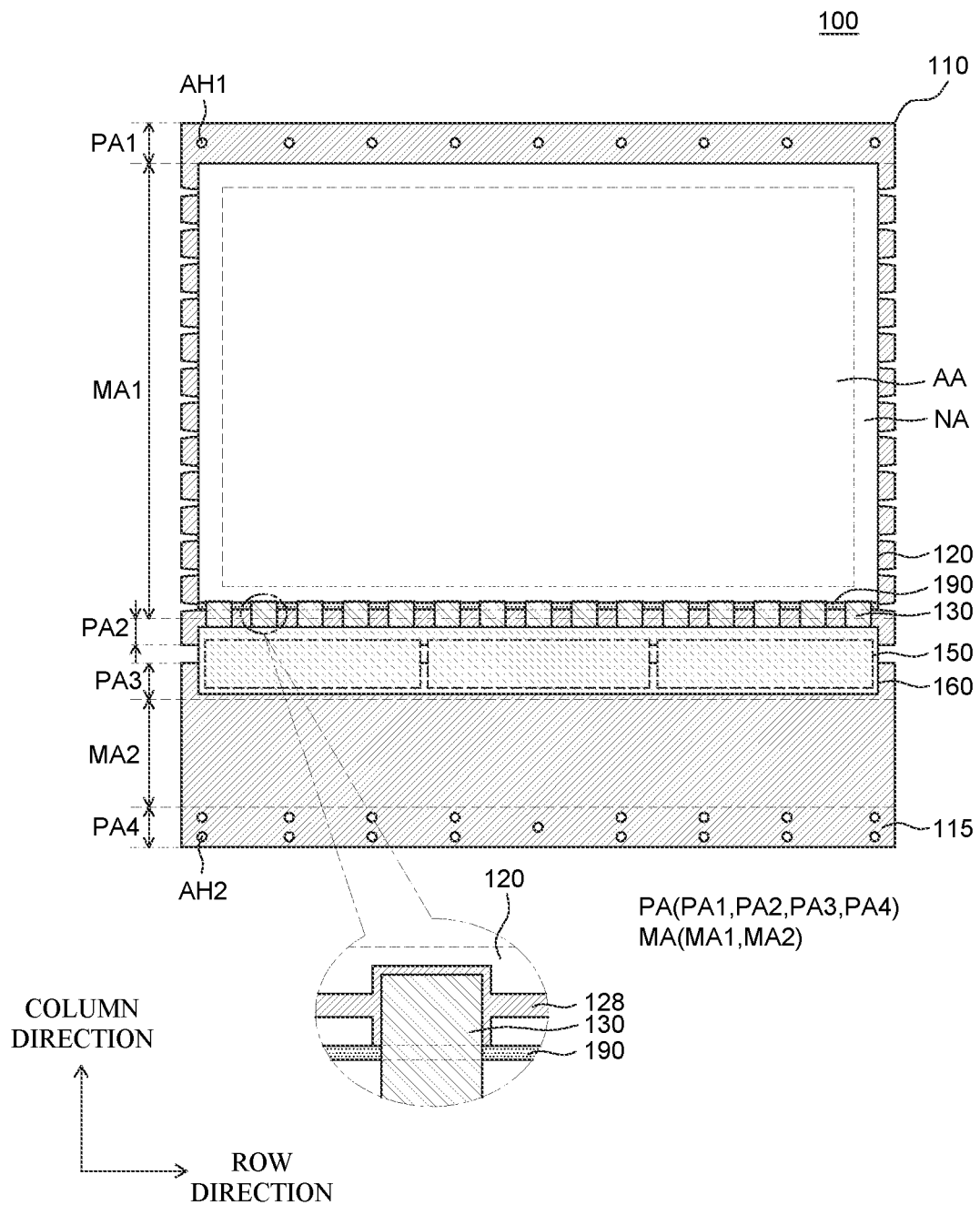
FIG. 2 is a plan view of a display device according to a first exemplary embodiment of the present disclosure.

FIG. 2 is a plan view of a display device according to a first exemplary embodiment of the present disclosure.

Figure 3A:
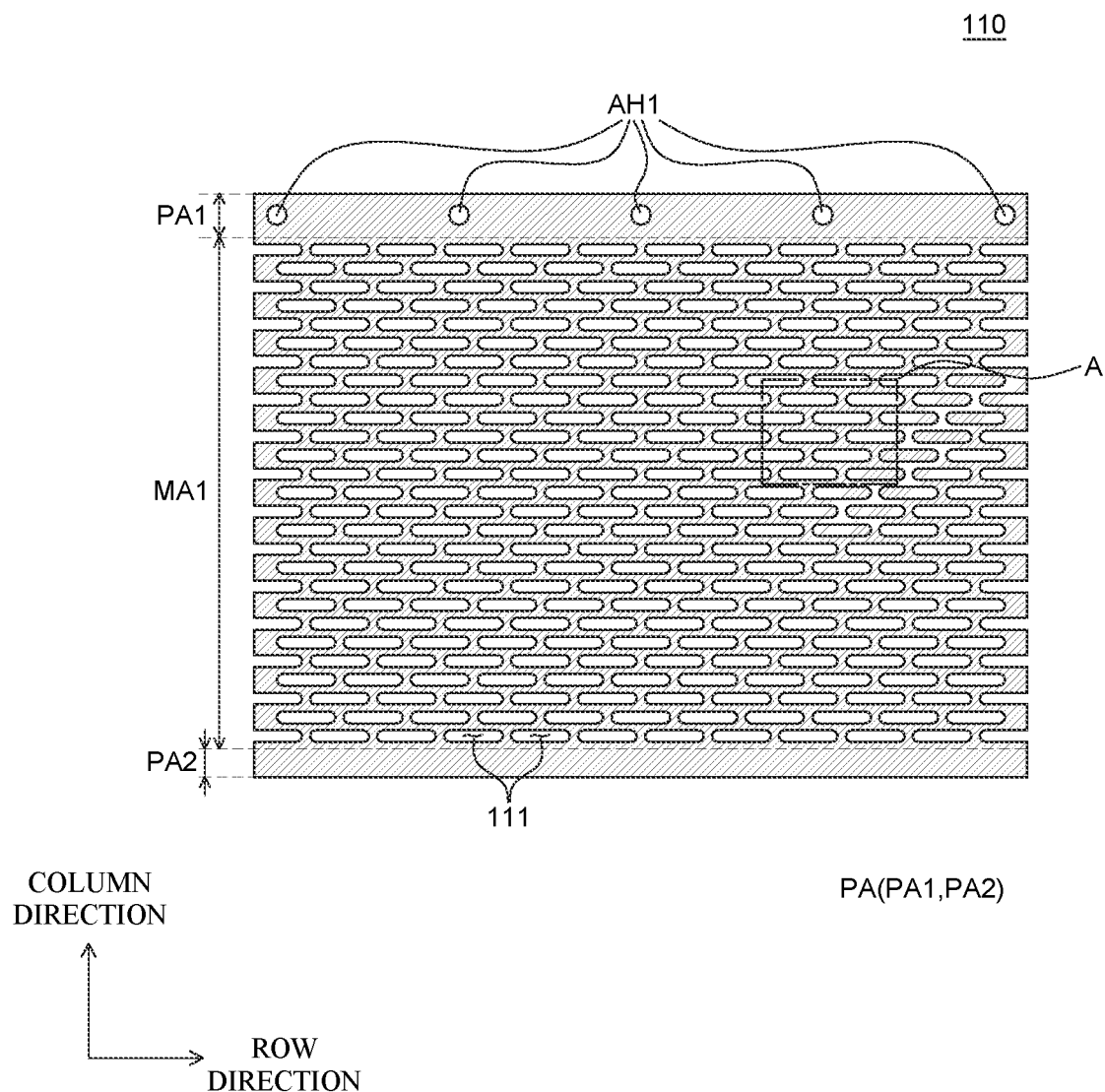
FIG. 3A is a plan view of a back cover of a display device according to a first exemplary embodiment of the present disclosure.

FIG. 3A is a plan view of a back cover of a display device according to a first exemplary embodiment of the present disclosure.

Figure 3B:
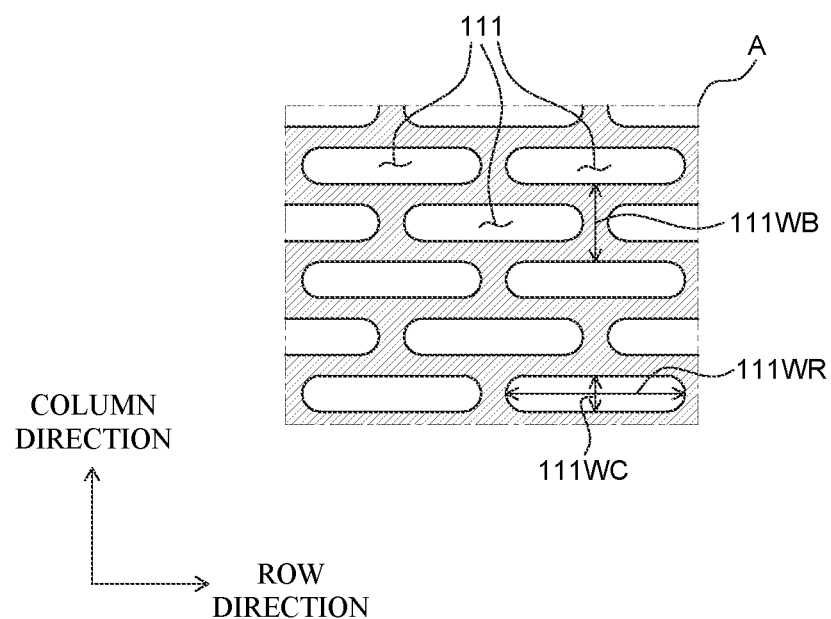
FIG. 3B is an enlarged view of a region A of FIG. 3A according to the first exemplary embodiment of the present disclosure.

FIG. 3B is an enlarged view of a region A of FIG. 3A according to the first exemplary embodiment of the present disclosure.

Figure 4:
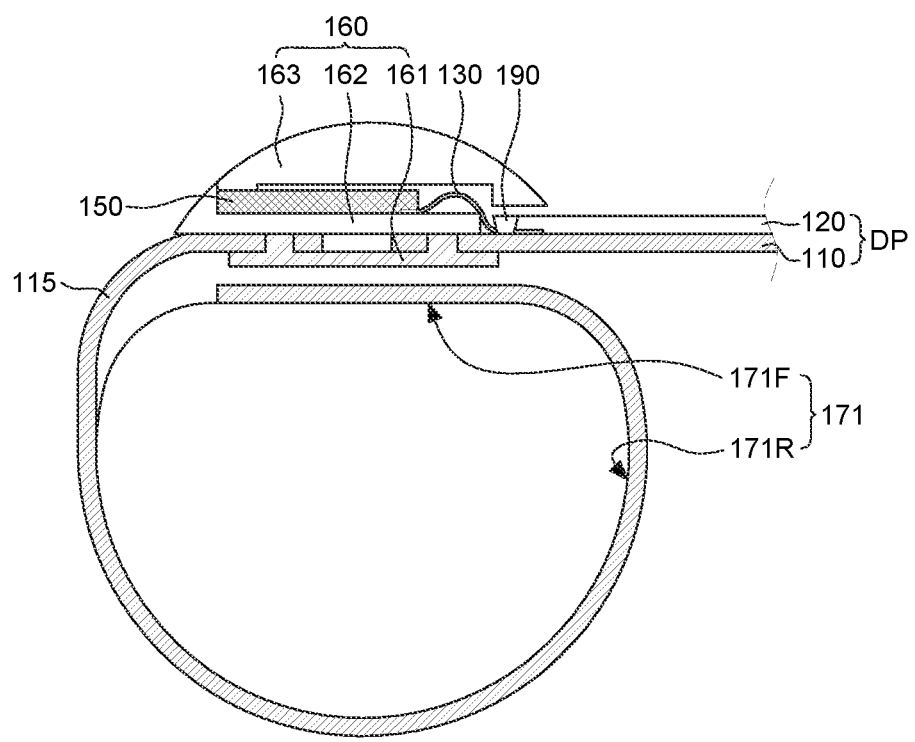
FIG. 4 is a partial cross-sectional view of a display device according to a first exemplary embodiment of the present disclosure.

FIG. 4 is a partial cross-sectional view of a display device according to the first exemplary embodiment of the present disclosure.

Figure 5:
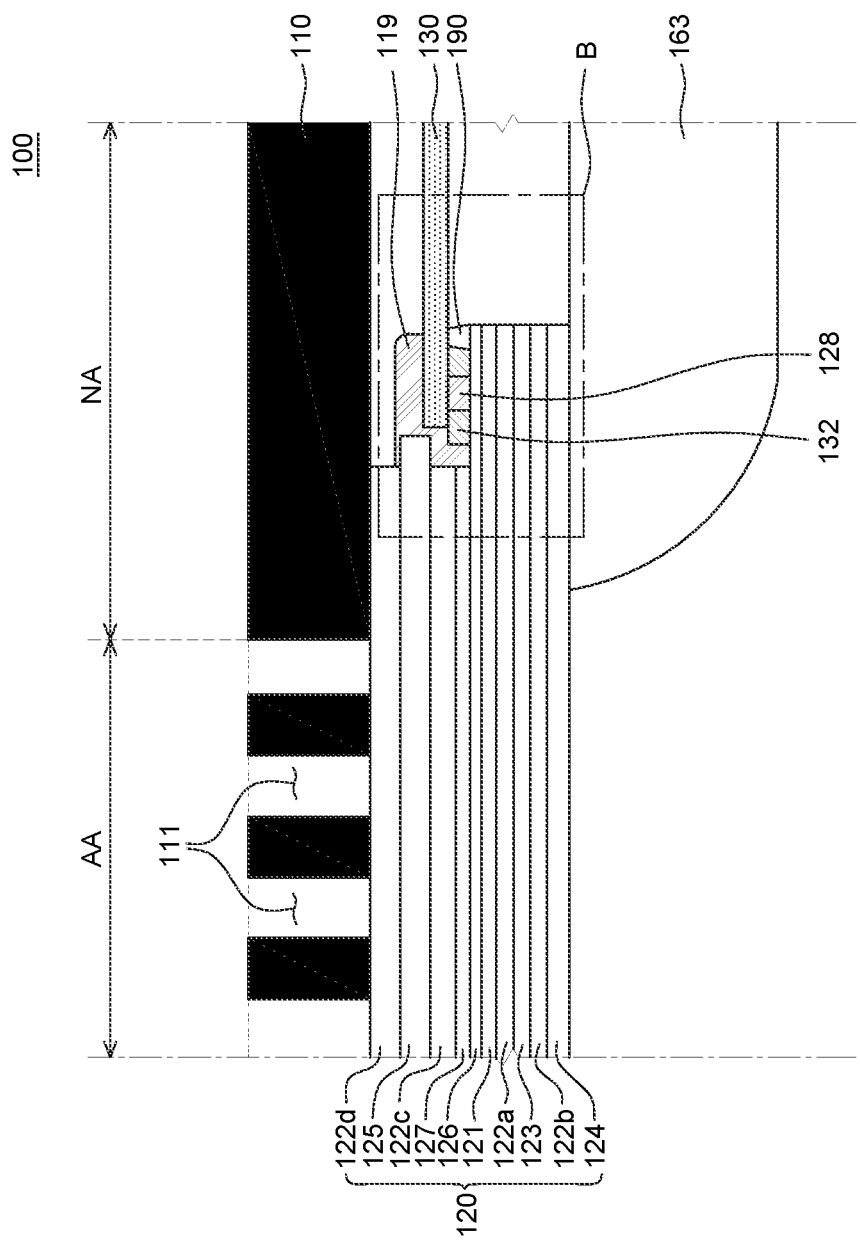
FIG. 5 is a view for enlarging a part of FIG. 4 according to the first exemplary embodiment of the present disclosure.

FIG. 5 is a view for enlarging a part of FIG. 4 according to the first exemplary embodiment of the present disclosure.

Figure 6:
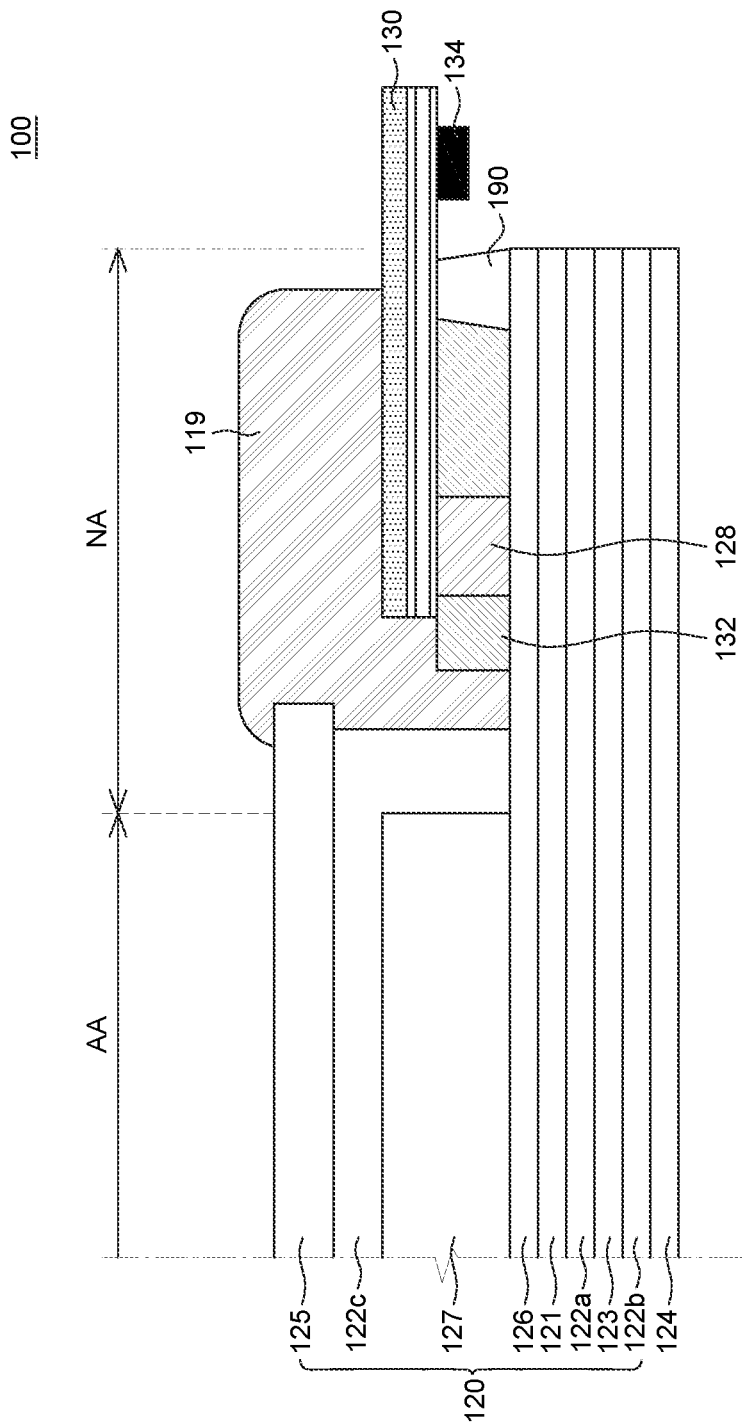
FIG. 6 is an enlarged view of a region B of FIG. 5 according to the first exemplary embodiment of the present disclosure.

FIG. 6 is an enlarged view of a region B of FIG. 5 according to the first exemplary embodiment of the present disclosure.

FIG. 2 illustrates a partial plan view of the display device 100 seen from the front surface. Even though FIG. 2 illustrates an example that the printed circuit board 150 is disposed on a front surface of the display panel 120, it is not limited thereto. Further, even though FIG. 2 illustrates an example configured by a back cover 110 and an extending sheet 115, it is not limited thereto so that the back cover 110 extends to a lower portion to be integrally configured with the extending sheet.

FIGS. 3A and 3B illustrate a configuration of the back cover 110 as an example.

FIG. 4 illustrates a state in which the roller 171 is fastened with the display unit DP.

FIG. 5 illustrates an edge portion of the display unit DP including the pad unit as an example.

Referring to FIGS. 2 to 6, the display unit DP includes a back cover 110, a display panel 120, a flexible film 130, and a printed circuit board 150.

Specifically, referring to FIG. 3A, the back cover 110 includes a plurality of support areas PA and a first malleable area MA1. The plurality of support areas PA are areas where a plurality of openings 111 are not disposed and the first malleable area MA1 is an area where a plurality of openings 111 are disposed. Specifically, a first support area PA1, the first malleable area MA1, and a second support area PA2 are sequentially disposed from the uppermost end of the back cover 110, but is not limited thereto.

The first support area PA1 of the back cover 110 is an uppermost area of the back cover 110 and is fastened with a head bar (not illustrated). The first support area PA1 includes first fastening holes AH1 to be fastened with the head bar. Further, a screw which passes through the head bar and the first fastening holes AH1 is disposed so that the head bar is fastened with the first support area PA1 of the back cover 110. As the first support area PA1 is fastened with the head bar, when the link unit (not illustrated) which is fastened with the head bar is lifted or lowered, the back cover 110 is also lifted and lowered and the display panel 120 which is attached to the back cover 110 is also lifted or lowered.

Even though five first fastening holes AH1 are illustrated in FIG. 3A, the number of first fastening holes AH1 is not limited thereto.

The first malleable area MA1 is an area extending from the first support area PA1 to a lower side of the back cover 110. The first malleable area MA1 is an area in which a plurality of openings 111 are disposed and the display panel 120 is attached.

When the display unit DP is wound around the roller 171 to be accommodated in the housing unit HP, the first malleable area MA1 of the back cover 110 and the display panel 120 which is attached to the first malleable area MA1 may be wound around the roller 171. In this case, in the first malleable area MA1 of the back cover 110, the plurality of openings 111 are formed so that the first malleable area MA1 may have a high flexibility and may be easily wound around the roller 171 together with the display panel 120.

The second support area PA2 is an area extending from the first malleable area MA1 to the lower side of the back cover 110. A flexible film 130 which is connected to one end of the display panel 120 and the printed circuit board 150 are attached to the second support area PA2. Further, in the second support area PA2, the cover unit 160 may be disposed to cover the flexible film 130 and the printed circuit board 150.

In order to protect the flexible film 130 and the printed circuit board 150, the second support area PA2 may support the flexible film 130 and the printed circuit board 150 to be wound around the roller 171 with a flat shape, rather than a curved shape. Further, a part of the roller 171 may be formed to be flat, corresponding to the second support area PA2, but is not limited thereto.

Referring to FIG. 2, the extending sheet 115 may be disposed at a lower side of the back cover 110 so as to dispose the display area AA of the display panel 120 at the outside of the housing unit HP, but the present disclosure is not limited thereto so that the back cover 110 extends to a lower side to configure an extending sheet.

For example, when the back cover 110 and the display panel 120 are fully unwound, an area from a lower side of the extending sheet 115 which is fixed to the roller 171 to an upper side of the extending sheet 115 which is fastened with the cover unit 160 may be disposed in the housing unit HP. The first malleable area MA1 and the first support area PA1 to which the display panel 120 is attached may be disposed at the outside of the housing unit HP.

The extending sheet 115 is fixed to the roller 171 by means of the second fastening hole AH2 and the extending sheet 115 may be fastened with the cover unit 160 by means of a predetermined fastening means.

For example, a lowermost end of the extending sheet 115 may be fastened with the roller 171. The second fastening holes AH2 may be formed at the lowermost end of the extending sheet 115 to be fastened with the roller 171. Screws which pass through the roller 171 and the second fastening hole AH2 are disposed so that the roller 171 and the extending sheet 115 may be fastened with each other.

As the extending sheet 115 is fastened with the roller 171, the extending sheet 115 may be wound around or unwound from the roller 171 by the rotation of the roller 171.

Even though seventeen second fastening holes AH2 are illustrated in FIG. 2, the number of second fastening holes AH2 is not limited thereto.

For example, the extending sheet 115 may be configured by the third support area PA3 which is fastened with the cover unit 160, the fourth supporting area PA4 which is fastened with the roller 171, and the second malleable area MA2 between the third support area PA3 and the fourth support area PA4. However, it is not limited thereto so that the extending sheet 115 may be configured by one support area or one malleable area.

The first malleable area MA1 of the back cover 110 is an area which is wound around or unwound from the roller 171 together with the display panel 120. The first malleable area MA1 may overlap at least the display panel 120 among other configurations of the display unit DP.

A plurality of openings 111 are disposed in the first malleable area MA1 of the back cover 110. Here, when the display unit DP is wound or unwound, the plurality of openings 111 may be deformed by a stress which is applied to the display unit DP. Specifically, when the display unit DP is wound or unwound, the first malleable area MA1 of the back cover 110 may be deformed as the plurality of openings 111 contracts or expands. As the plurality of openings 111 contracts or expands, a slip phenomenon of the display panel 120 disposed on the first malleable area MA1 of the back cover 110 is reduced so that the stress which is applied to the display panel 120 may be reduced.

That is, in the display device 100 according to the first exemplary embodiment of the present disclosure, even though the display unit DP is wound or unwound to apply a stress to the display unit DP, the plurality of openings 111 of the back cover 110 are flexibly deformed to relieve the stress applied to the back cover 110 and the display panel 120. For example, when the back cover 110 and the display panel 120 are wound around the roller 171, a stress which deforms the back cover 110 and the display panel 120 in a vertical direction may be applied. In this case, the plurality of openings 111 of the back cover 110 may extend in a vertical direction of the back cover 110 and the length of the back cover 110 may be flexibly deformed. Therefore, the difference in lengths of the back cover 110 and the display panel 120 caused by the difference in radii of curvature during the process of winding the back cover 110 and the display panel 120 may be compensated by the plurality of openings 111 of the back cover 110.

Further, a stress which is applied to the display panel 120 from the back cover 110 due to the deformation of the plurality of openings 111 during the process of winding the back cover 110 and the display panel 120 may also be relieved.

Referring to FIGS. 3A and 3B, the plurality of openings 111 may be disposed to be staggered from a plurality of openings 111 in adjacent rows. For example, a plurality of openings 111 disposed in one row is disposed to be staggered from a plurality of openings 111 disposed in a row adjacent to the row. Specifically, centers of the plurality of openings 111 disposed in an odd-numbered row and centers of the plurality of openings 111 disposed in an even-numbered row are disposed to be staggered and for example, may be staggered by a half of a width 111WR in a row direction of the openings 111. However, the arrangement and the shape of the plurality of openings 111 illustrated in FIG. 3A is just an example, and is not limited thereto.

In the first support area PA1 and the second support area PA2, the plurality of openings 111 as formed in the first malleable area MA1 is not formed. The first fastening holes AH1 have different shapes from those of the plurality of openings 111.

In the meantime, the first support area PA1 of the back cover 110 and the lowermost end of the extending sheet 115 are fixed to the head bar and the roller 171, respectively, so that the first support area PA1 and the lowermost end of the extending sheet need to be more rigid than the first malleable area MA1. As the first support area PA1 and the lowermost end of the extending sheet 115 have rigidity, the first support area PA1 and the lowermost end of the extending sheet 115 may be firmly fixed to the head bar and the roller 171. Therefore, the display unit DP is fixed to the roller 171 and the head bar of the driving unit (not illustrated) to be moved to the inside or the outside of the housing unit HP in accordance with the operation of the driving unit.

Referring to FIGS. 2 to 6 again, the display panel 120 may be disposed on an upper surface of the back cover 110. For example, the display panel 120 is disposed in the first malleable area MA1, on the upper surface of the back cover 110.

The display panel 120 is a panel for displaying images to a user.

The display panel 120 may include a display element which displays images, a driving element which drives the display element, wiring lines which transmit various signals to the display element and the driving element, and the like.

The display element may be defined in different manners depending on the type of the display panel 120. For example, when the display panel 120 is an organic light emitting display panel, the display element may be an organic light emitting diode which includes an anode, an organic light emitting layer, and a cathode. For example, when the display panel 120 is a liquid crystal display panel, the display element may be a liquid crystal display element. Hereinafter, even though the display panel 120 is assumed as an organic light emitting display panel as an example, the display panel 120 is not limited to the organic light emitting display panel. Further, since the display device 100 according to the first exemplary embodiment of the present disclosure is a rollable display device, the display panel 120 may be implemented as a flexible display panel to be wound around or unwound from the roller 171.

The display panel 120 may include a display area AA and a non-display area NA.

The display area AA is an area where images are displayed in the display panel 120.

In the display area AA, a plurality of sub pixels which configures the plurality of pixels and a driving circuit for driving the plurality of sub pixels may be disposed.

The plurality of sub pixels are minimum units which configure the display area AA and a display element may be disposed in each of the plurality of sub pixels. For example, an organic light emitting diode which includes an anode, an organic light emitting layer, and a cathode may be disposed in each of the plurality of sub pixels, but it is not limited thereto. Further, a driving circuit for driving the plurality of sub pixels may include a driving element, a wiring line, and the like. For example, the driving circuit may be configured by a thin film transistor, a storage capacitor, a gate line, a data line, and the like, but is not limited thereto.

The non-display area NA is an area where an image is not displayed. In the non-display area NA, various wiring lines, circuits, and the like for driving the organic light emitting diode of the display area AA are disposed. For example, in the non-display area NA, a link line which transmits signals to the plurality of sub pixels and driving circuits of the display area AA, or a driving IC 134 such as a gate driver IC or a data driver IC and a plurality of flexible films 130 may be disposed, but the non-display area is not limited thereto. The pad unit may be located in the non-display area NA below the display panel 120.

As described above, the plurality of flexible films 130 may be disposed in the second support area PA2 of the back cover 110. The plurality of flexible films 130 are films in which various components, such as the driving IC 134, are disposed on a base film having a malleability and supplies a signal to the plurality of sub pixels and the driving circuits of the display area AA and is electrically connected to the display panel 120.

One end of the plurality of flexible films 130 are disposed in the non-display area NA of the display panel 120 to supply a power voltage, a data voltage, or the like to the plurality of sub pixels and the driving circuits of the display area AA.

The driving IC 134, such as a gate driver IC or a data driver IC, may be disposed on the flexible films 130. The driving IC 134 is a component which processes data for displaying images and a driving signal for processing the images.

The driving IC 134 may be disposed by a chip on glass (COG), a chip on film (COF), a tape carrier package (TCP), or the like technique depending on a mounting method. However, for the convenience of description, it is described that the driving IC 134 is mounted on the plurality of flexible films 130 by a COF technique, but is not limited thereto.

Further, a plurality of first pads 132 may be disposed in the non-display area NA.

The first pad 132 is a conductive component which transmits various signals from the flexible film 130 to the display unit DP and the driving unit.

For example, the first pad 132 may transmit various signals such as a data signal, a high potential voltage, a low potential voltage, a clock signal, or the like through the wiring line. Even though in FIG. 5, it is illustrated that the first pad 132 is disposed on the buffer layer 126, it is not limited thereto and the plurality of first pads 132 may be disposed on various insulating layers which may be disposed in the non-display area NA, for example, on an inorganic insulating layer.

The flexible film 130 may be electrically connected to the first pad 132 disposed on the substrate 121.

A conductive adhesive layer 128 may be disposed between the substrate 121 and the flexible film 130. The conductive adhesive layer 128 fixes the substrate 121 and the flexible film 130 and may electrically connect the first pad 132 and a second pad 133 of the flexible film 130. For example, the conductive adhesive layer 128 may be formed by dispersing conductive particles in an adhesive material and may be formed of anisotropic conductive film ACF. The substrate 121 and the flexible film 130 are fixed by the adhesive material of the conductive adhesive layer 128 and the first pad 132 and the second pad 133 are electrically connected by an electrical path formed by the conductive particles.

When the flexible film 130 is attached, the conductive adhesive layer 128 is pressed to protrude more than the flexible film 130 and as illustrated in FIG. 2, a width between an area where the flexible film 130 is located and an area where the flexible film 130 is not located may be different. However, it is not limited thereto.

Further, the printed circuit board 150 is disposed on an upper surface of the second support area PA2 of the back cover 110 to be coupled to the plurality of flexible films 130. However, it is not limited thereto so that the printed circuit board 150 may be disposed on a rear surface of the back cover 110.

The printed circuit board 150 is a component which supplies signals to the driving IC 134. Various components may be disposed in the printed circuit board 150 to supply various signals, such as a driving signal or a data signal, to the driving IC 134.

In the meantime, an additional printed circuit board which is connected to the printed circuit board 150 may be further disposed. For example, the printed circuit board 150 may be referred to as a source printed circuit board S-PCB on which the data driver is mounted and the additional printed circuit board connected to the printed circuit board 150 may be referred to as a control printed circuit board C-PCB on which a timing controller is mounted. For example, the additional printed circuit board may be disposed in the roller 171 or disposed in the housing unit HP at the outside of the roller 171, or disposed to be in direct contact with the printed circuit board 150.

The display unit DP according to the present disclosure may further include a cover unit 160.

The cover unit 160 is disposed in the second support area PA2 of the back cover 110 to accommodate the printed circuit board 150. The printed circuit board 150, a part of the back cover 110 corresponding to the printed circuit board 150, and a part of the extending sheet 115 may be inserted into the cover unit 160. The cover unit 160 is disposed to cover the printed circuit board 150 to protect the printed circuit board 150.

The cover unit 160 may include a base plate 161, a bottom plate 162, and a cover plate 163, but is not limited thereto.

The base plate 161 may be disposed on an opposite surface of one surface of the back cover 110 and the extending sheet 115, that is, a rear surface. The base plate 161 may be fixed to the second support area PA2 on the rear surface of the back cover 110 on which the display panel 120 is not disposed. That is, the base plate 161 and the printed circuit board 150 may be disposed so as to correspond to each other with the back cover 110 and the extending sheet 115 therebetween. Therefore, the base plate 161 may support the printed circuit board 150 together with the second support area PA2. For example, the base plate 161 is formed of a material having a rigidity to support the second support area PA2 to be flat, but is not limited thereto.

A bottom plate 162 may be disposed on one surface of the back cover 110, that is, an upper surface.

The bottom plate 162 may be disposed to support the printed circuit board 150 disposed above the second support area PA2 of the back cover 110. The bottom plate 162 may be disposed between the printed circuit board 150 and the back cover 110. The bottom plate 162 may have a groove in which the printed circuit board 150 is seated so as not to move. That is, in the bottom plate 162, a portion where the printed circuit board 150 is seated may be concave. Therefore, the movement of the printed circuit board 150 disposed in the bottom plate 162 is reduced and the printed circuit board 150 may be stably disposed. However, the present disclosure is not limited thereto and the bottom plate 162 may be formed to have a flat upper surface.

The cover plate 163 may be disposed on the upper surface of the back cover 110.

The cover plate 163 may be disposed to cover the printed circuit board 150 disposed above the second support area PA2 of the back cover 110 and may have a convex upper surface. That is, the upper surface of the cover plate 163 may be formed as a curved surface. The cover plate 163 may be fixed to the second support area PA2 and the base plate 161 on the upper surface of the back cover 110 on which the display panel 120 and the printed circuit board 150 are disposed. The cover plate 163 is formed of a material having a rigidity to protect the printed circuit board 150, but is not limited thereto.

In the meantime, the cover unit 160 and the back cover 110 may be fastened with each other. For example, a plurality of fixing holes are formed in the second support area PA2 of the back cover 110 and the protrusion protruding from the base plate 161 is inserted into the fixing hole so that the cover unit 160 and the back cover 110 may be fastened with each other. Alternatively, for example, the cover unit 160 and the back cover 110 may be fastened with each other by a fastening member such as a screw which passes through the base plate 161, the bottom plate 162, the cover plate 163, and the back cover 110. In this case, the fastening member such as a screw may be disposed so as not to interfere with the printed circuit board 150 to dispose the printed circuit board 150 at the inside of the cover unit 160. However, the present disclosure is not limited thereto and the cover unit 160 and the back cover 110 may be fastened with each other by various methods.

Further, the cover unit 160 and the extending sheet 115 may be also fastened with each other by the above-described method. For example, a plurality of fixing holes are formed in the extending sheet 115 and the protrusion protruding from the base plate 161 is inserted into the fixing hole so that the cover unit 160 and the extending sheet 115 may be fastened with each other. Alternatively, for example, the cover unit 160 and the extending sheet 115 may be fastened with each other by a fastening member such as a screw which passes through the base plate 161, the bottom plate 162, the cover plate 163, and the extending sheet 115.

However, the present disclosure is not limited thereto and the cover unit 160 and the extending sheet 115 may be fastened with each other by various methods.

When the display unit DP is wound, the cover plate 163 of the cover unit 160 having the rigidity maintains an original convex shape without being deformed to protect the plurality of flexible films 130 and the printed circuit board 150. The cover plate 163 having a convex shape may form a substantially circular shape together with a curved portion 171R of the roller 171. For example, the base plate 161 having a flat shape and the cover plate 163 having a convex shape may form a substantial D shape. The cover unit 160 having a substantial D shape is seated on a flat portion 171F of the roller 171 to form a substantially circular shape together with the curved portion 171R of the roller 171. Accordingly, the second cover unit 160 and the roller 171 form one substantially circular shape and a part of the display panel 120 which is wound on the cover unit 160 is wound with a larger radius of curvature so that a stress applied to the display panel 120 may be reduced.

The non-display area NA may be an area which encloses the display area AA as illustrated in FIG. 2, but it is not limited thereto and the non-display area NA may be defined as an area extending from the display area AA.

In the meantime, the display panel 120 includes a substrate 121, a buffer layer 126, a pixel unit 122, an encapsulation layer 122c, and an encapsulation substrate 125.

The substrate 121 is a base member which supports various components of the display panel 120 and may be configured by an insulating material. The substrate 121 may be formed of a material having flexibility so that the display panel 120 is wound or unwound. For example, the substrate 121 may be formed of a plastic material such as polyimide PI.

The buffer layer 126 is disposed on the substrate 121. The buffer layer 126 suppresses moisture and/or oxygen which penetrates from the outside of the substrate 121 from being spread. The buffer layer 126 may be formed of an inorganic material, for example, may be configured by a single layer or a double layer of silicon oxide SiOx and silicon nitride SiNx, but is not limited thereto.

The pixel unit 127 is disposed on upper surfaces of the substrate 121 and the buffer layer 126. The pixel unit 127 may include a plurality of organic light emitting diodes and a circuit for driving the organic light emitting diodes. The pixel unit 127 may be disposed so as to correspond to the display area AA.

The display panel 120 may be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer may be formed below the anode to allow the light emitted from the organic light emitting diode to travel to the upper portion of the substrate 121, that is, toward the cathode.

According to the bottom emission type, light emitted from the organic light emitting diode is emitted to a lower portion of the substrate 121 on which the organic light emitting diode is formed. In the case of the bottom emission type, the anode may be formed only of a transparent conductive material and the cathode may be formed of the metal material having a high reflectance to allow the light emitted from the organic light emitting diode to travel to the lower portion of the substrate 121.

Hereinafter, for the convenience of description, the description will be made by assuming that the display device 100 is a bottom emission type display device, but it is not limited thereto.

Even though not illustrated in the drawings, a thin film transistor may be disposed in the pixel unit 127 above the substrate 121. The thin film transistor may be used as a driving element of the display device 100.

The thin film transistor may include a gate electrode, an active layer, a source electrode, and a drain electrode. For example, the thin film transistor may have a structure in which an active layer is disposed above the gate electrode and the source electrode and the drain electrode are disposed on the active layer, that is, a bottom gate structure in which the gate electrode is disposed on the lowermost portion, but is not limited thereto.

The gate electrode of the thin film transistor may be disposed above the substrate 121. The gate electrode may be any one selected from various metal materials, for example, any one selected from molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

A gate insulating layer may be disposed on the gate electrode. The gate insulating layer may be formed as a single layer of silicon nitride SiNx or silicon oxide SiOx which is an inorganic material or a multiple layer of silicon nitride SiNx or silicon oxide SiOx, but it is not limited thereto.

The active layer may be disposed on the gate insulating layer. For example, the active layer may be formed of an oxide semiconductor or amorphous silicon (a-Si), polycrystalline silicon (poly-Si), an organic semiconductor, or the like.

The source electrode and the drain electrode may be disposed on the active layer. The source electrode and the drain electrode may be disposed on the same layer to be spaced apart from each other. The source electrode and the drain electrode may be any one selected from various metal materials, for example, any one selected from molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

A planarization layer may be disposed above the thin film transistor.

The planarization layer protects the thin film transistor and alleviates steps of layers disposed above the substrate 121.

The organic light emitting diode may be disposed above the planarization layer. The organic light emitting diode is a self-emitting element and is driven by the thin film transistor disposed in the sub pixel. The organic light emitting diode may include an anode, an organic light emitting layer on the anode, and a cathode on the organic light emitting layer.

The anode may be disposed on the planarization layer to be divided for each of the sub pixels. The anode may be electrically connected to the drain electrode of the thin film transistor by means of a contact hole formed on the planarization layer.

When the display device 100 is a bottom emission type, the anode may be configured by a transparent conductive layer formed of a conductive material having a high work function. For example, the anode may be formed of transparent conductive oxide such as indium tin oxide (ITO), indium zinc oxide (IZO), indium tin zinc oxide (ITZO), zinc oxide (ZnO), and tin oxide (TO), but is not limited thereto.

A bank may be disposed on the anode and the planarization layer.

The bank is an insulating layer to divide adjacent sub pixels. For example, the bank may be formed of an organic insulating material formed to cover an edge of the anode and may be formed of polyimide, acrylic or benzocyclobutene (BCB) based resin, but is not limited thereto.

The organic light emitting layer is a layer for emitting light having a specific color and may include at least one of a red light emitting layer, a green light emitting layer, a blue light emitting layer, and a white light emitting layer. The organic light emitting layer may be disposed between the anode and the cathode. The organic light emitting layer may be configured by one light emitting layer or may be a structure in which a plurality of light emitting layers which emits different color light are laminated. The organic light emitting layer may further include an organic layer such as a hole injection layer, a hole transport layer, an electron transport layer, and an electron injection layer, in addition to the organic light emitting layer.

The cathode may be disposed on the organic light emitting layer. When the display device 100 is a bottom emission type, the cathode may be formed of a metal material such as silver (Ag), copper (Cu), a magnesium-silver alloy, or the like.

The flexible film 130 may be disposed in the non-display area NA of the substrate 121. The flexible film 130 is a film in which various components, such as the driving IC 134, are disposed on a base film having a malleability. The flexible film 130 is a film which supplies signals to the plurality of sub pixels and the circuit of the display area AA. The flexible film 130 is disposed at one end of the non-display area NA to supply a data signal, a high potential voltage, a low potential voltage, a clock signal, and the like to the plurality of sub pixels and the circuit of the display area AA.

The encapsulation layer 122c may be disposed so as to cover the pixel unit 127.

The encapsulation layer 122c seals the organic light emitting diode of the pixel unit 127. The encapsulation layer 122c may protect the organic light emitting diode of the pixel unit 127 from moisture, oxygen, and impacts of the outside. The encapsulation layer 122c may be formed by alternately laminating a plurality of inorganic layers and a plurality of organic layers. For example, the inorganic layer may be formed of an inorganic material such as silicon nitride SiNx, silicon oxide SiOx, and aluminum oxide AlOx and the organic layer may be formed of epoxy or acrylic polymer, but they are not limited thereto.

The encapsulation substrate 125 is disposed on the encapsulation layer 122c. Specifically, the encapsulation substrate 125 is disposed between the encapsulation layer 122c and the back cover 110. At this time, the encapsulation substrate 125 may protect the organic light emitting diode of the pixel unit 127 together with the encapsulation layer 122c. That is, the encapsulation substrate 125 may protect the organic light emitting diode of the pixel unit 127 from moisture, oxygen, and impacts of the outside. For example, the encapsulation substrate 125 may be formed of a material having a high modulus of approximately 200 to 900 MPa. The encapsulation substrate 125 may be formed of a metal material, which has a high corrosion resistance and is easily processed in the form of a foil or a thin film, such as aluminum (Al), nickel (Ni), chromium (Cr), and an alloy material of iron (Fe) and nickel. When the encapsulation substrate 125 is formed of a metal material, the encapsulation substrate 125 may be implemented as an ultra-thin film and provide a strong resistance against external impacts and scratches, but it is not limited thereto.

An adhesive layer may be disposed between the encapsulation layer 122c and the encapsulation substrate 125. The adhesive layer may bond between the encapsulation layer 122c and the encapsulation substrate 125. The adhesive layer is formed of a material having adhesiveness and may be a thermosetting or natural curable type adhesive. For example, the adhesive layer may be formed of an optical clear adhesive (OCA), a pressure sensitive adhesive (PSA), or the like, but is not limited thereto.

In the meantime, the adhesive layer may be disposed to enclose the encapsulation layer 122c and the pixel unit 127. That is, the pixel unit 127 may be sealed by the buffer layer 126 and the encapsulation layer 122c and the encapsulation layer 122c and the pixel unit 127 may be sealed by the buffer layer 126 and the adhesive layer. The adhesive layer may further include a moisture absorbent. The moisture absorbent may be particles having hygroscopicity and absorb moisture and oxygen from the outside to reduce permeation of the moisture and oxygen into the pixel unit 127.

An adhesive member 122d may be disposed between the encapsulation substrate 125 and the back cover 110. The adhesive member 122d may bond the encapsulation substrate 125 and the back cover 110. The adhesive member 122d is formed of a material having adhesiveness and may be a thermosetting or natural curable type adhesive. For example, the adhesive member 122d may be formed of a double-sided tape, an optical clear adhesive (OCA), a pressure sensitive adhesive PSA, or the like, but is not limited thereto.

At this time, even though in FIG. 5, it is illustrated that the plurality of openings 111 is not filled with the adhesive member 122d, the adhesive member 122d may be filled in some or all of the plurality of openings 111 of the back cover 110. If the adhesive member 122d is filled inside the plurality of openings 111 of the back cover 110, a contact area between the adhesive member 122d and the back cover 110 is increased so that a peel-off phenomenon between the adhesive member 122d and the back cover 110 may be avoided.

As described above, the display panel 120 may include a substrate 121, a buffer layer 126, a pixel unit 122, an encapsulation layer 122c, and an encapsulation substrate 125. Even though in FIG. 6, the buffer layer 126 is not illustrated for the purpose of convenience, the buffer layer 126 may be disposed on the substrate 121.

In the meantime, a barrier film 123 may be disposed below the substrate 121.

A first adhesive layer 122a may be disposed between the barrier film 123 and the substrate 121.

The first adhesive layer 122a is formed of a material having an adhesiveness and may be a thermosetting or natural curing adhesive. For example, the first adhesive layer 122a may be formed of an optical clear adhesive (OCA), a pressure sensitive adhesive (PSA), or the like, but is not limited thereto.

A polarizing plate 124 is disposed below the barrier film 123. The polarizing plate 124 selectively transmits light to reduce the reflection of external light which is incident onto the display panel 120. Specifically, the display panel 120 may include various metal materials applied to the semiconductor element, the wiring line, and the organic light emitting diode. Therefore, the external light incident onto the display panel 120 may be reflected from the metal material so that the visibility of the display device 100 may be reduced due to the reflection of the external light. However, when the polarizing plate 124 is disposed, the polarizing plate 124 suppresses the reflection of the external light so that the outdoor visibility of the display device 100 may be increased. However, the polarizing plate 124 may be omitted depending on an implementation example of the display device 100.

A second adhesive layer 122b may be disposed between the barrier film 123 and the polarizing plate 124.

The second adhesive layer 122b is formed of a material having an adhesiveness and may be a thermosetting or natural curing adhesive. For example, the second adhesive layer 122b may be formed of an optical clear adhesive (OCA), a pressure sensitive adhesive (PSA), or the like, but is not limited thereto.

A sealing layer 119 may be disposed on the buffer layer 126 in the non-display area NA of the substrate 121. The sealing layer 119 may be disposed so as to cover one end of the flexible film 130.

The sealing layer 119 may be disposed so as to enclose the display area AA in the non-display area NA and also disposed so as to enclose the pixel unit 127, the encapsulation layer 122c, and the encapsulation substrate 125. As illustrated in FIG. 5, the sealing layer 119 may be disposed to enclose the pixel unit 127, the encapsulation layer 122c, and the encapsulation substrate 125 in the non-display area NA while covering side surfaces of the pixel unit 127, the encapsulation layer 122c, and the encapsulation substrate 125, but is not limited thereto. In the meantime, the sealing layer 119 may be disposed to enclose a part of the side surface of the adhesive member 122d.

As described above, the sealing layer 119 may be formed to suppress moisture permeation through the side portion of the display device 100 and reduce the defect in a subsequent process.

The sealing layer 119 may be configured by micro seal, but is not limited thereto.

In the meantime, the display device 100 according to the first exemplary embodiment of the present disclosure forms a dam 190 at the ends of the substrate 121 to suppress the overflowing of the conductive adhesive layer 128 at the end and suppress un-curing of the micro seal. By doing this, the curling of the substrate 121 and the tearing of the flexible film 130 may be suppressed.

A large size rollable display device is being developed as a next generation display device. A COF or an anisotropic conductive film (ACF) bonding technique may be applied to the rollable display device to be driven. Further, the rollable display device may form a sealing layer on the pad unit with micro seal to suppress the curling of the polyimide substrate and lateral moisture permeation.

In the rollable display device, a micro seal process is performed after a COF tape automated bonding (COF TAB) during the module process. In this case, the micro seal is permeated into the edge of the substrate to which the COF is bonded, which causes an un-curing issue. When UV curing is performed after coating the micro seal, a part of the UV is absorbed so that the lower portion of the COF is not cured. Further, when the micro seal is not applied, an uncured remaining film is generated below the COF and the polyimide substrate is curled after the laser lift off (LLO) process so that a reliability problem may be caused. Even though the ACF attachment position moves to the downside, the ACF is spread by the bonding to run down to the outer edge of the substrate so that the peeling may not be performed during the subsequent LLO process.

Therefore, the display device 100 according to the first exemplary embodiment of the present disclosure forms the dam 190 at an end of the display panel 120, that is, the substrate 121 to limit the spreading boundary of the conductive adhesive layer 128 by the attachment of the conductive adhesive layer 128 and the bonding of the COF. Therefore, the overflowing of the conductive adhesive layer 128 at the end of the substrate 121 may be suppressed.

The dam 190 may be disposed on the buffer layer 126 at the end of the substrate 121.

In the display device 100 according to the first exemplary embodiment of the present disclosure, the flexible film 130 is attached to be in contact with the dam 190 to suppress the permeation of the micro seal into a lower area of the flexible film 130, thereby suppressing the un-curing of the micro seal.

A height of the dam 190 may be set to 30 μm or higher in consideration of the height of the conductive adhesive layer 128 and a width of the dam 190 may be set to 2 μm or lower to ensure an open area of the pad unit, but is not limited thereto.

When the conductive adhesive layer 128 is attached, the conductive adhesive layer is spread to be pushed up to a predetermined height of a side surface of the dam 190, but is not limited thereto. Further, the dam 190 may be in inwardly contact with the conductive adhesive layer 128, but is not limited thereto.

The driving IC 134 may be mounted on the rear surface of the flexible film 130 at the outer edge of the dam 190, but is not limited thereto.

The dam 190 may have a trapezoidal shape in which a lower portion is longer than an upper portion, but is not limited thereto.

When the planarization layer or the bank is formed in the pixel unit 127, the dam 190 may be formed at the end of the substrate 121 with a material which configures the planarization layer or the bank, but is not limited thereto.

The dam 190 may be formed over the entire end of the display panel 120.

After forming the dam 190, the cutting process of the substrate 121 may be performed so that the side surface of the dam 190 may be exposed together with the substrate 121.

Simultaneously, side surfaces of the first adhesive layer 122a, the barrier film 123, the second adhesive layer 122b, and the polarizing plate 124 are also exposed together with the substrate 121. However, the present disclosure is not limited thereto so that according to the present disclosure, the side surfaces of the first adhesive layer, the barrier film, the second adhesive layer, and the polarizing plate may be covered using the dam, which will be described below in more detail with reference to FIG. 7.

Figure 7:
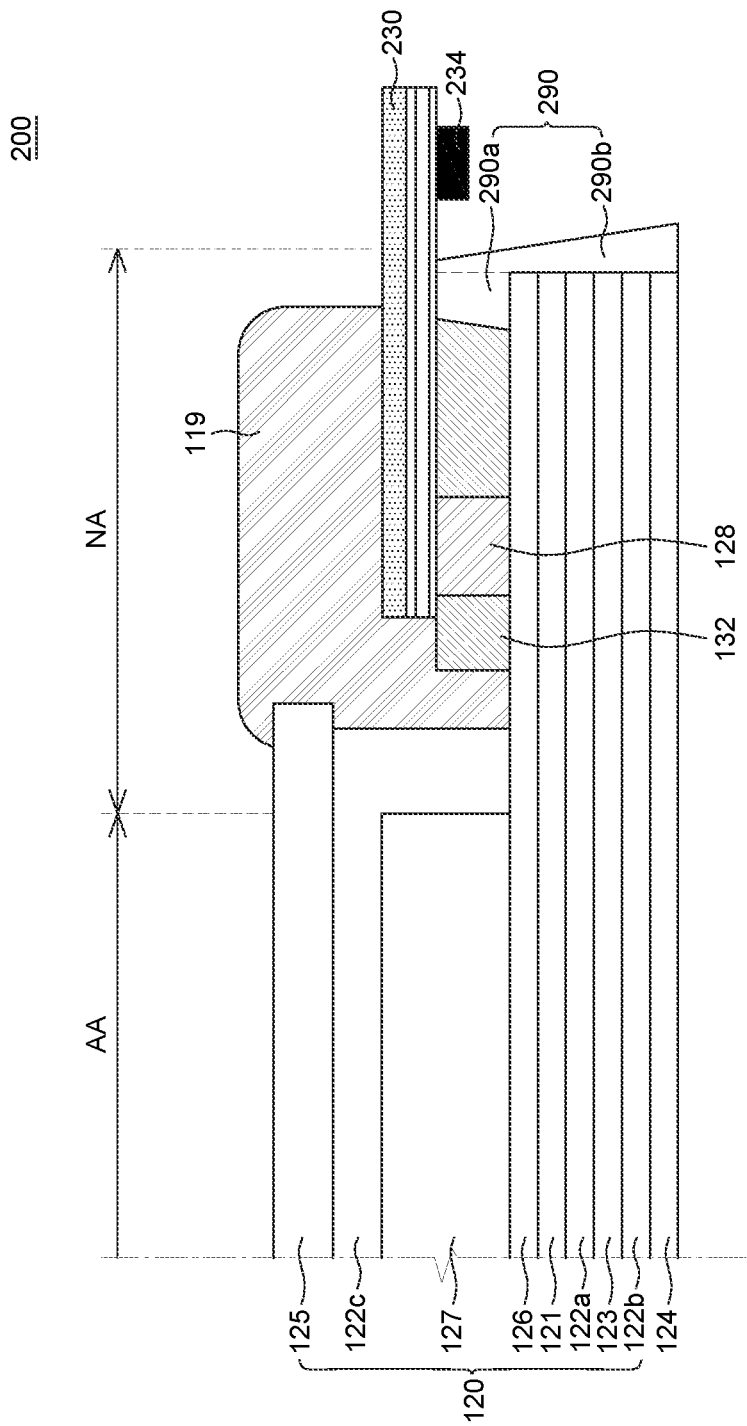
FIG. 7 is a partial cross-sectional view of a display device according to a second exemplary embodiment of the present disclosure.

FIG. 7 is a partial cross-sectional view of a display device according to a second exemplary embodiment of the present disclosure.

A display device 200 of FIG. 7 is substantially formed with the same configuration as the display device 100 of FIGS. 2 to 6, except for a structure of a dam 290. Accordingly, the same configuration is denoted by the same reference numeral, and a description thereof will be omitted.

In FIG. 7, for the purpose of convenience, the back cover 110 and the cover unit 160 are not illustrated.

FIG. 7 illustrates an edge portion of the display unit DP including the pad unit as an example.

Referring to FIG. 7, the display panel 120 may be disposed on an upper surface of the back cover 110.

As described above, the plurality of flexible films 230 are disposed in the second support area PA2 of the back cover 110. In the plurality of flexible films 230, various components, such as a driving IC 234, are disposed on a base film having a malleability to supply a power voltage or a data voltage to the plurality of sub pixels and the driving circuits of the display area AA.

A conductive adhesive layer 128 may be disposed between the substrate 121 and the flexible film 230.

In the meantime, the display panel 120 may include a substrate 121, a buffer layer 126, a pixel unit 127, an encapsulation layer 122c, and an encapsulation substrate 125. Even though in FIG. 7, the buffer layer 126 is not illustrated for the purpose of convenience, the buffer layer 126 may be disposed on the substrate 121. The components of the display panel 120 have been described in detail above so that the detailed description thereof will be omitted.

A sealing layer 119 may be disposed on the buffer layer 126 in the non-display area NA of the substrate 121. The sealing layer 119 may be disposed so as to cover one end of the flexible film 230.

The sealing layer 119 may be formed between the encapsulation layer 122c and the dam 290.

The sealing layer 119 may be disposed so as to enclose the display area AA in the non-display area NA and also disposed so as to enclose the pixel unit 127, the encapsulation layer 122c, and the encapsulation substrate 125. As illustrated in FIG. 7, the sealing layer 119 may be disposed to enclose the pixel unit 127, the encapsulation layer 122c, and the encapsulation substrate 125 while covering side surfaces of the pixel unit 127, the encapsulation layer 122c, and the encapsulation substrate 125, but is not limited thereto. The sealing layer 119 may be disposed to cover a part of the upper surface of the encapsulation substrate 125.

As described above, the sealing layer 119 may be formed to suppress moisture permeation through the side portion of the display device 200 and reduce the defect in a subsequent process.

The sealing layer 119 may be configured by micro seal, but is not limited thereto.

As described above, a dam 290 may be formed at the end of the substrate 121.

The dam 290 according to the second exemplary embodiment of the present disclosure is configured by a first dam 290a disposed at an end of the substrate 121 where the flexible film 230 is disposed and a second dam 290b disposed to cover the side surfaces of the first dam 290a and the substrate 121.

The flexible film 230 may be attached such that a rear surface thereof is in contact with the dam 290.

When the conductive adhesive layer 128 is attached, the conductive adhesive layer is spread to be pushed up to a predetermined height of a side surface of the first dam 290a.

The driving IC 234 may be mounted on the rear surface of the flexible film 230 at the outer edge of the dam 290, but is not limited thereto.

The first dam 290a may have a trapezoidal shape in which a lower portion is longer than an upper portion, but is not limited thereto.

When the planarization layer or the bank is formed in the pixel unit 127, the first dam 290a may be formed at the end of the substrate 121 using a material which configures the planarization layer or the bank, but is not limited thereto.

The dam 290 may be formed over the entire end of the display panel 120.

After forming the first dam 290a, the cutting process of the substrate 121 may be performed so that the side surface of the first dam 290a may be exposed together with the substrate 121. Simultaneously, side surfaces of the first adhesive layer 122a, the barrier film 123, the second adhesive layer 122b, and the polarizing plate 124 are also exposed together with the substrate 121.

Thereafter, after the COF bonding process, the second dam 290b may be formed to cover the side surfaces of the first dam 290a and the substrate 121. The second dam 290b may be formed to cover the side surfaces of the first adhesive layer 122a, the barrier film 123, the second adhesive layer 122b, and the polarizing plate 124.

The second dam 290b extends along the side surface of the display panel 120 to be in contact with the cover plate 163 of the cover unit 160 (see FIG. 5).

According to the second exemplary embodiment of the present disclosure, the second dam 290b is additionally formed to cover the side surfaces of the first dam 290a and the substrate 121 (and the first adhesive layer 122a, the barrier film 123, the second adhesive layer 122b, and the polarizing plate 124) to reinforce the side surface of the display panel 120.

According to the second exemplary embodiment of the present disclosure, a getter is added in the second dam 290b to suppress the moisture permeation from the side surface of the display panel 120. The getter is a material applied to adsorb or inactivate impurities such as moisture.

Figure 8:
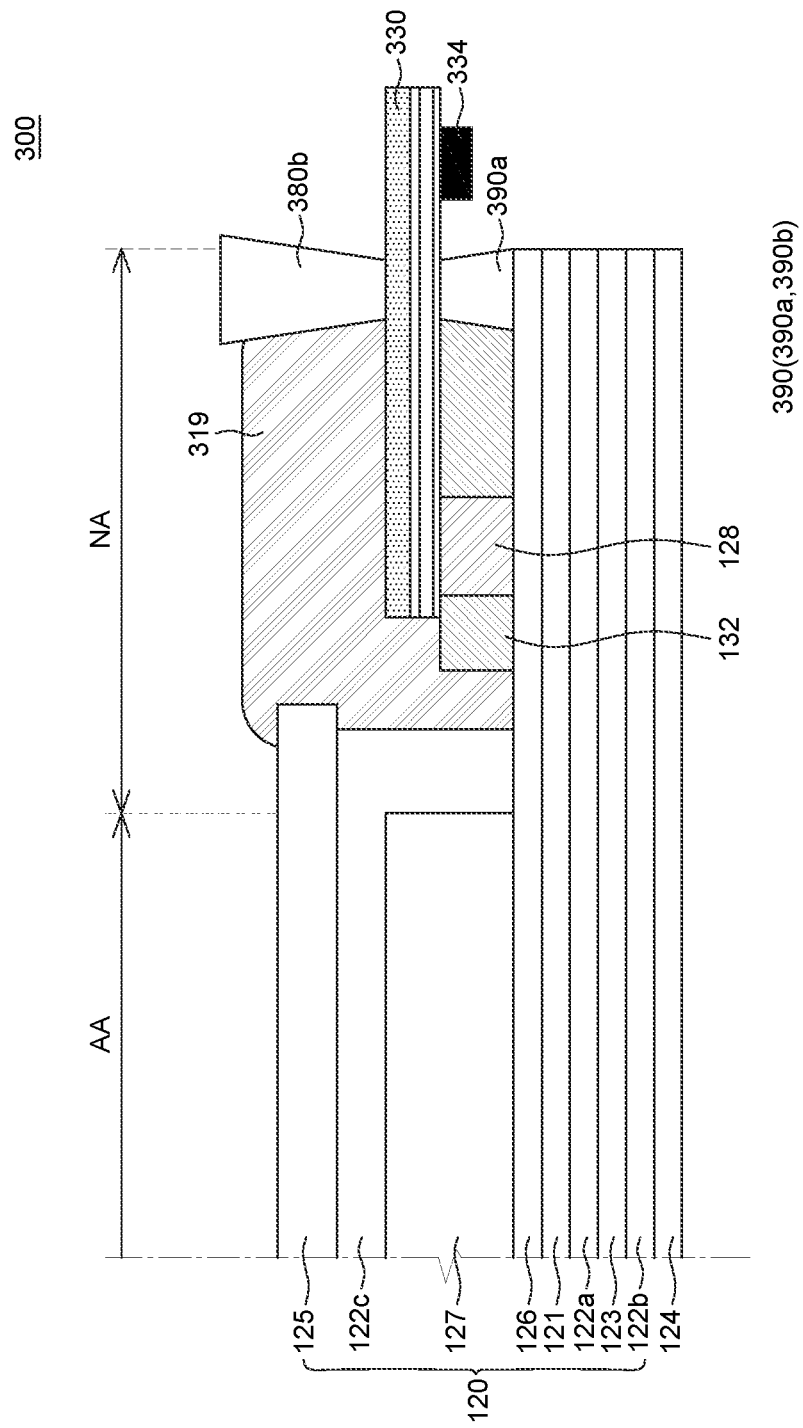
FIG. 8 is a partial cross-sectional view of a display device according to a third exemplary embodiment of the present disclosure.

FIG. 8 is a partial cross-sectional view of a display device according to a third exemplary embodiment of the present disclosure.

A display device 300 of FIG. 8 is substantially formed with the same configuration as the display device 100 of FIGS. 2 to 6, except for a structure of a dam 390. Accordingly, the same configuration is denoted by the same reference numeral, and a description thereof will be omitted.

In FIG. 8, for the purpose of convenience, the back cover 110 and the cover unit 160 are not illustrated.

Referring to FIG. 8, the display panel 120 is disposed on an upper surface of the back cover 110.

As described above, a plurality of flexible films 330 may be disposed in the second support area PA2 of the back cover 110. In the plurality of flexible films 330, various components, such as a driving IC 334, are disposed on a base film having a malleability to supply a power voltage or a data voltage to the plurality of sub pixels and the driving circuits of the display area AA.

Even though in FIG. 8, the buffer layer 126 is not illustrated for the purpose of convenience, the buffer layer 126 may be disposed on the substrate 121. The components of the display panel 120 have been described in detail above so that the detailed description thereof will be omitted.

A sealing layer 319 may be disposed on the buffer layer 126 in the non-display area NA of the substrate 121. The sealing layer 319 may be disposed so as to cover one end of the flexible film 330.

The sealing layer 319 may be formed between the encapsulation layer 122c and the dam 390.

As described above, the dam 390 may be formed at the end of the substrate 121 where the flexible film 330 is located.

The dam 390 according to the third exemplary embodiment of the present disclosure is configured by a lower dam 390a disposed on a rear surface of the flexible film 330 and an upper dam 390b disposed on an upper surface of the flexible film 330, at the end of the substrate 121.

The lower dam 390a and the upper dam 390b may be disposed to be opposite to each other, but are not limited thereto.

The rear surface and the upper surface of the flexible film 330 may be attached to be in contact with the lower dam 390a and the upper dam 390b, respectively.

When the conductive adhesive layer 128 is attached, the conductive adhesive layer is spread to be pushed up to a predetermined height of a side surface of the lower dam 390a.

The driving IC 334 may be mounted on the rear surface of the flexible film 330 at the outer edge of the lower dam 390a, but is not limited thereto.

The lower dam 390a may have a trapezoidal shape in which a lower portion is longer than an upper portion and the upper dam 390b may have a reverse trapezoidal shape in which an upper portion is longer than a lower portion, but is not limited thereto.

When the planarization layer or the bank is formed in the pixel unit 127, the lower dam 390a may be formed at the end of the substrate 121 using a material which configures the planarization layer or the bank, but is not limited thereto.

The upper dam 390b may be formed to be higher than the height of the sealing layer 319, but is not limited thereto.

The lower dam 390a may be formed over the entire end of the display panel 120.

After forming the lower dam 390a, the cutting process of the substrate 121 may be performed so that the side surface of the lower dam 390a may be exposed together with the substrate 121. Simultaneously, side surfaces of the first adhesive layer 122a, the barrier film 123, the second adhesive layer 122b, and the polarizing plate 124 are also exposed together with the substrate 121.

Thereafter, the upper dam 390b may be formed on the upper surface of the flexible film 330 after the COF bonding process.

According to the third exemplary embodiment of the present disclosure, the upper dam 390b is further formed not only on the rear surface of the flexible film 330, but also on the upper surface so as to cover the side surface of the sealing layer 319. Further, when the getter is added in the lower dam 390a and the upper dam 390b, the moisture permeation from the side surface may be effectively blocked.

Figure 9:
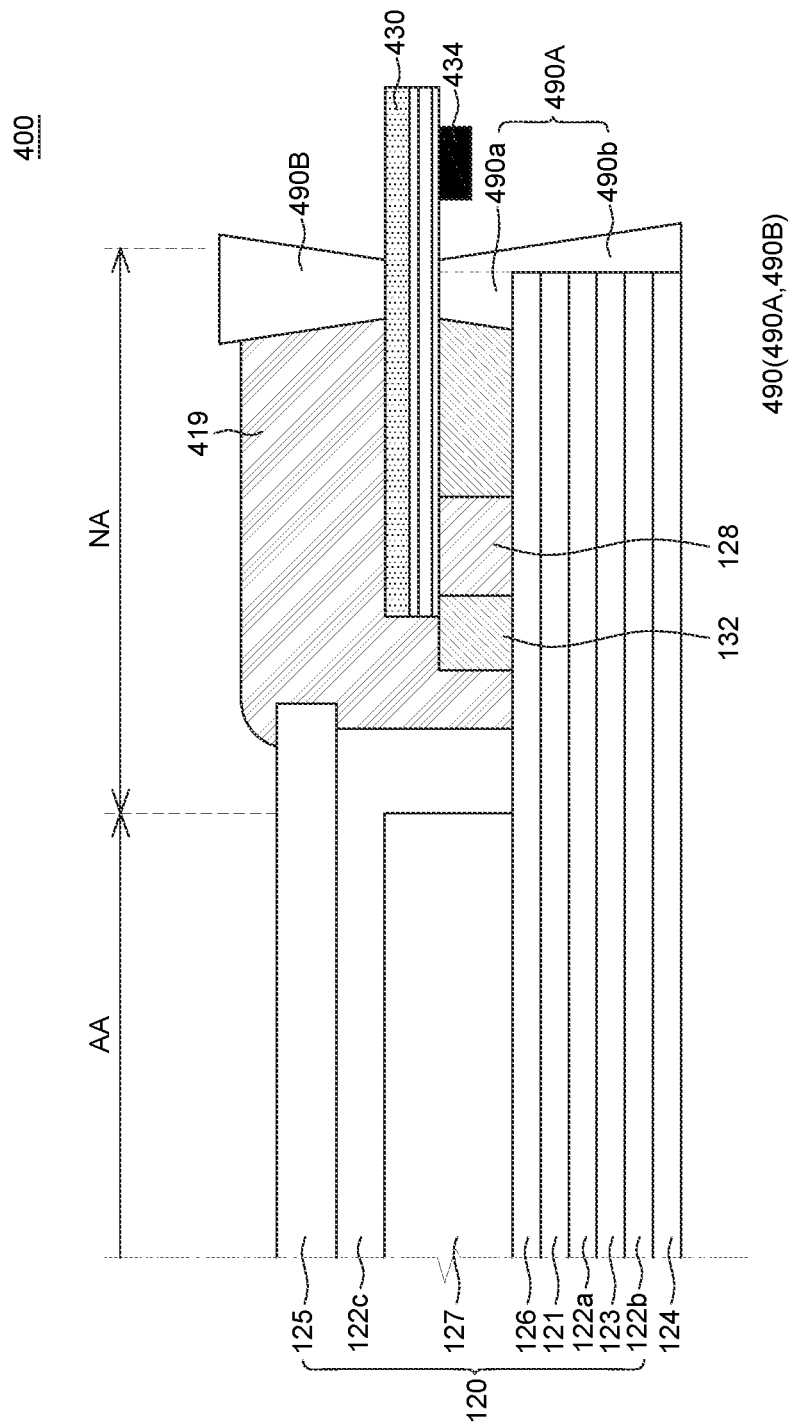
FIG. 9 is a partial cross-sectional view of a display device according to a fourth exemplary embodiment of the present disclosure.

FIG. 9 is a partial cross-sectional view of a display device according to a fourth exemplary embodiment of the present disclosure.

A display device 400 of FIG. 9 is substantially formed with the same configuration as the display device 100 of FIGS. 2 to 6, except for a structure of a dam 490. Accordingly, the same configuration is denoted by the same reference numeral, and a description thereof will be omitted.

In FIG. 9, for the purpose of convenience, the back cover 110 and the cover unit 160 are not illustrated.

Referring to FIG. 9, the display panel 120 is disposed on an upper surface of the back cover 110.

As described above, a plurality of flexible films 430 may be disposed in the second support area PA2 of the back cover 110. In the plurality of flexible films 430, various components, such as a driving IC 434, are disposed on a base film having a malleability to supply a power voltage or a data voltage to the plurality of sub pixels and the driving circuits of the display area AA.

Even though in FIG. 9, the buffer layer 126 is not illustrated for the purpose of convenience, the buffer layer 126 may be disposed on the substrate 121. The components of the display panel 120 have been described in detail above so that the detailed description thereof will be omitted.

A sealing layer 419 may be disposed on the buffer layer 126 in the non-display area NA of the substrate 121. The sealing layer 419 may be disposed so as to cover one end of the flexible film 430.

The sealing layer 419 may be formed between the encapsulation layer 122c and the dam 490.

As described above, the dam 490 may be formed at the end of the substrate 121 where the flexible film 430 is located.

The dam 490 according to the fourth exemplary embodiment of the present disclosure is configured by a lower dam 490A disposed on a rear surface of the flexible film 430 and an upper dam 490B disposed on an upper surface of the flexible film 430, at the end of the substrate 121.

The lower dam 490A according to the fourth exemplary embodiment of the present disclosure is configured by a first lower dam 490a disposed at an end of the substrate 121 where the flexible film 430 is disposed and a second lower dam 490b disposed to cover the side surfaces of the first lower dam 490a and the substrate 121.

The lower dam 490A and the upper dam 490B may be disposed to be opposite to each other, but are not limited thereto.

The rear surface and the upper surface of the flexible film 430 may be attached to be in contact with the lower dam 490A and the upper dam 490B, respectively.

When the conductive adhesive layer 128 is attached, the conductive adhesive layer is spread to be pushed up to a predetermined height of a side surface of the first lower dam 490a.

The driving IC 434 may be mounted on the rear surface of the flexible film 430 at the outer edge of the lower dam 490A, but is not limited thereto.

The first lower dam 490a may have a trapezoidal shape in which a lower portion is longer than an upper portion and the upper dam 490B may have a reverse trapezoidal shape in which an upper portion is longer than a lower portion, but is not limited thereto.

When the planarization layer or the bank is formed in the pixel unit 127, the first lower dam 490a may be formed at the end of the substrate 121 using a material which configures the planarization layer or the bank, but is not limited thereto.

The upper dam 490B may be formed to be higher than the height of the sealing layer 419, but is not limited thereto.

The lower dam 490A may be formed over the entire end of the display panel 120.

After forming the first lower dam 490a, the cutting process of the substrate 121 may be performed so that the side surface of the first lower dam 490a may be exposed together with the substrate 121. Simultaneously, side surfaces of the first adhesive layer 122a, the barrier film 123, the second adhesive layer 122b, and the polarizing plate 124 are also exposed together with the substrate 121.

Thereafter, after the COF bonding process, the second lower dam 490b may be formed to cover the side surfaces of the first lower dam 490a and the substrate 121. The second lower dam 490b may be formed to cover the side surfaces of the first adhesive layer 122a, the barrier film 123, the second adhesive layer 122b, and the polarizing plate 124. Further, the upper dam 490B may be formed on the upper surface of the flexible film 430.

In the meantime, the second lower dam 490b extends along the side surface of the display panel 120 to be in contact with the cover unit 160.

According to the fourth exemplary embodiment of the present disclosure, the upper dam 490B is further formed not only on the rear surface of the flexible film 430, but also on the upper surface so as to cover the side surface of the sealing layer 419. Further, when the getter is added in the lower dam 490A and the upper dam 490B, the moisture permeation from the side surface may be effectively blocked.

Further, according to the fourth exemplary embodiment of the present disclosure, the second lower dam 490b is formed to cover the side surfaces of the first lower dam 490a and the substrate 121 (and the first adhesive layer 122a, the barrier film 123, the second adhesive layer 122b, and the polarizing plate 124) to reinforce the side surface of the display panel 120.

Figure 10:
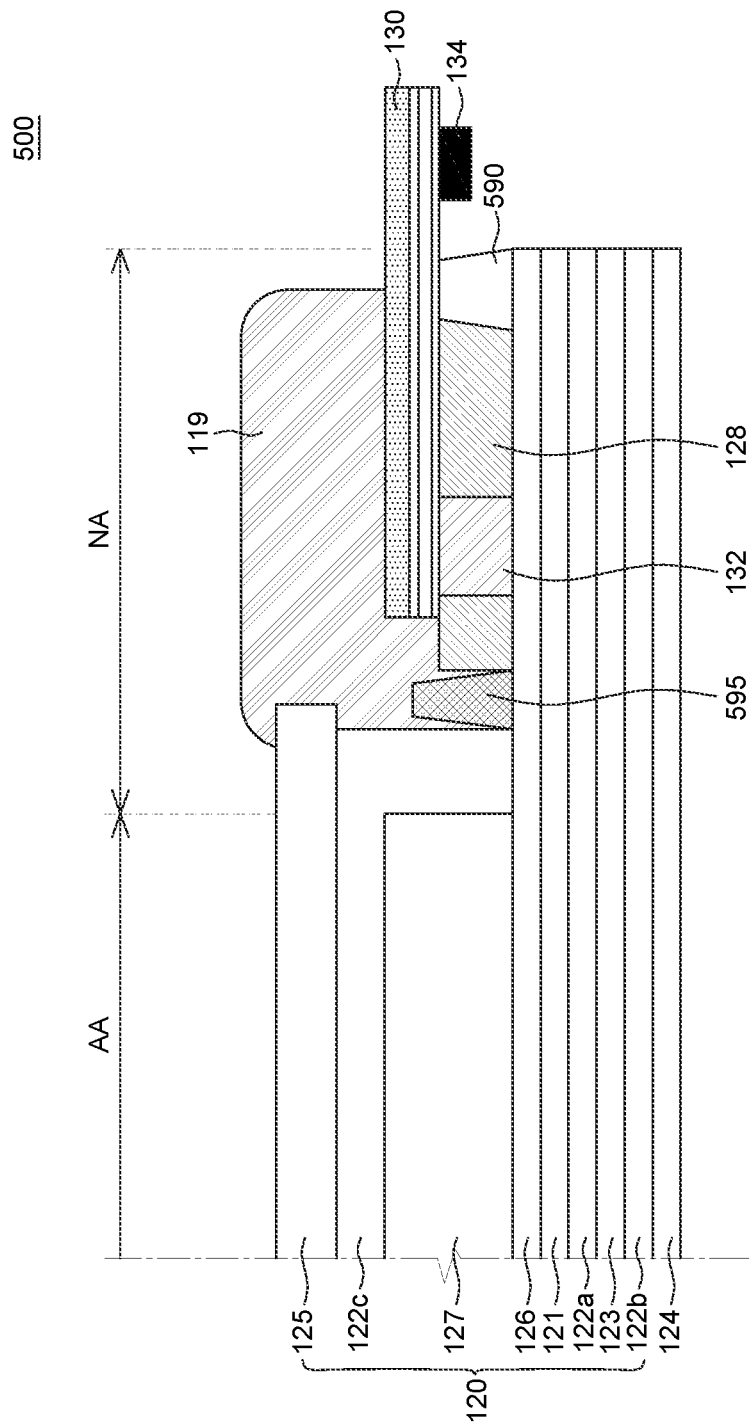
FIG. 10 is a partial cross-sectional view of a display device according to a fifth exemplary embodiment of the present disclosure.

FIG. 10 is a partial cross-sectional view of a display device according to a fifth exemplary embodiment of the present disclosure.

A display device 500 of FIG. 10 is substantially formed with the same configuration as the display device 100 of FIGS. 2 to 6, except for a structure of an auxiliary dam 595. Accordingly, the same configuration is denoted by the same reference numeral, and a description thereof will be omitted.

Referring to FIG. 10, a dam 590 may be formed at the end of the substrate 121 where the flexible film 130 is located.

In the display device 500 according to the fifth exemplary embodiment of the present disclosure, an auxiliary dam 595 is additionally disposed between the encapsulation layer 122c and the dam 590.

A sealing layer 119 may be disposed on the buffer layer 126 in the non-display area NA of the substrate 121. The sealing layer 119 may be disposed so as to cover one end of the flexible film 130.

The sealing layer 119 may be formed between the encapsulation layer 122c and the dam 590 to cover the auxiliary dam 595.

The auxiliary dam 595 may be disposed to be spaced apart from the encapsulation layer 122c or may be disposed to be in contact with the encapsulation layer 122c.

A conductive adhesive layer 128 may be disposed between the dam 590 and the auxiliary dam 595.

The driving IC 134 may be mounted on the rear surface of the flexible film 130 at the outer edge of the dam 590, but is not limited thereto.

The dam 590 may be formed over the entire end of the display panel 120. Further, the auxiliary dam 595 may be formed over the entire end of the display panel 120 or may be formed to enclose four surfaces of the display panel 120.

According to the fifth exemplary embodiment of the present disclosure, the auxiliary dam 595 is provided in addition to the dam 590 so that the moisture permeation into the side surface of the pixel unit 127 may be effectively blocked.

Figure 11:
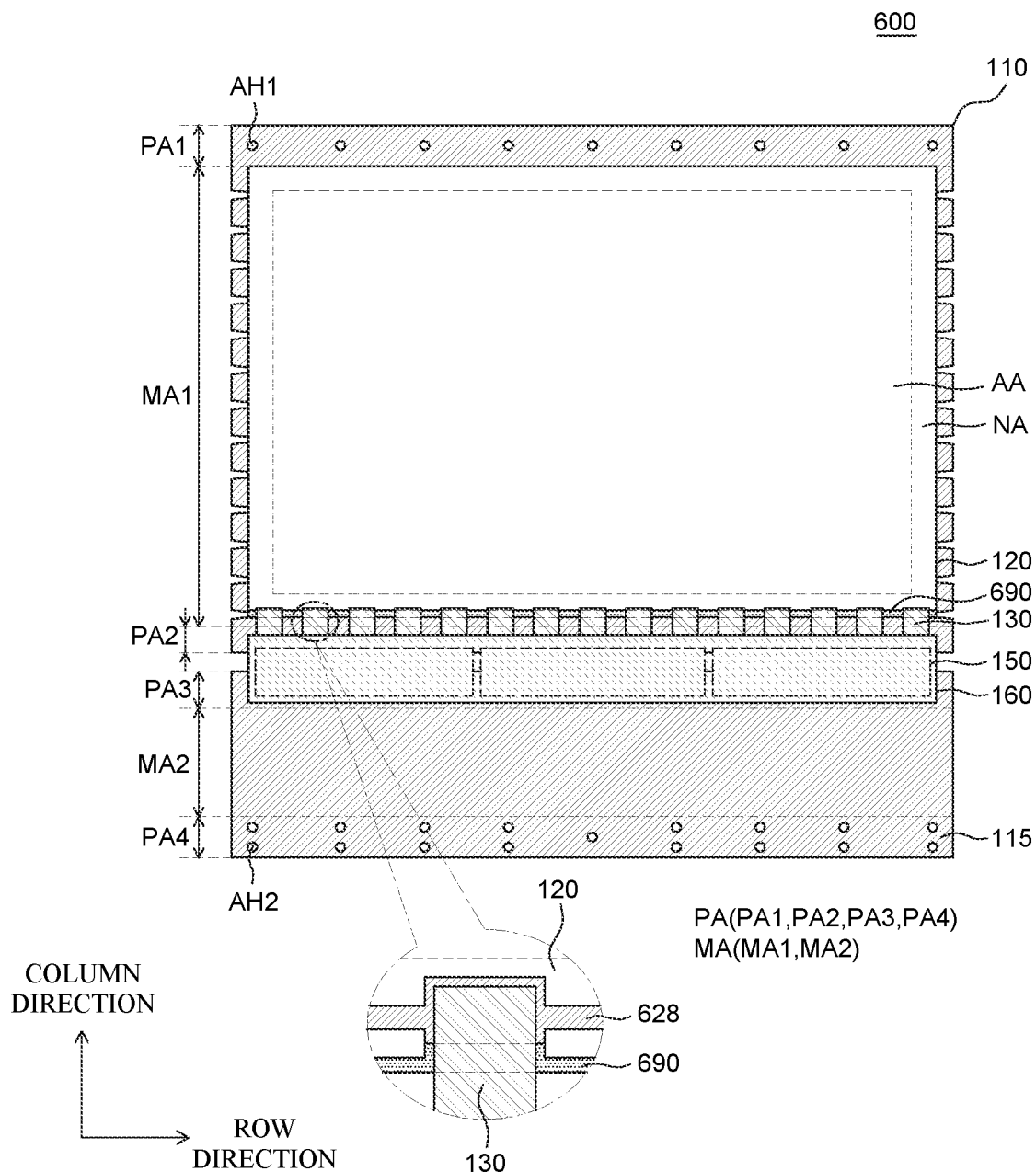
FIG. 11 is a plan view of a display device according to a sixth exemplary embodiment of the present disclosure.

FIG. 11 is a plan view of a display device according to a sixth exemplary embodiment of the present disclosure.

A display device 600 of FIG. 11 is substantially formed with the same configuration as the display device 100 of FIGS. 2 to 6, except for a structure of a dam 690. Accordingly, the same configuration is denoted by the same reference numeral, and a description thereof will be omitted.

FIG. 11 illustrates a partial plan view of the display device 600 seen from the front surface. Even though FIG. 11 illustrates an example that the printed circuit board 150 is disposed on a front surface of the display panel 120, it is not limited thereto. Further, even though FIG. 11 illustrates an example configured by the back cover 110 and the extending sheet 115, it is not limited thereto so that the back cover 110 extends to a lower portion to be integrally configured with the extending sheet.

Referring to FIG. 11, the display panel 120 is disposed on an upper surface of the back cover 110.

A conductive adhesive layer 628 may be disposed between the substrate 121 and the flexible film 130.

When the flexible film 130 is attached, the conductive adhesive layer 628 is pressed to protrude more than the flexible film 130 and as illustrated in FIG. 11, a width between an area where the flexible film 130 is located and an area where the flexible film 130 is not located may be different. However, it is not limited thereto.

As described above, the dam 690 may be formed at the end of the substrate 121 where the flexible film 130 is located.

The dam 690 according to the sixth exemplary embodiment of the present disclosure is disposed on the rear surface of the flexible film 130 at the end of the substrate 121 and protrudes toward the conductive adhesive layer 628 where the flexible film 130 is located.

That is, the dam 690 may be formed over the entire end of the display panel 120. Further, the dam 690 may have different widths in an area where the flexible film 130 is located and an area where the flexible film 130 is not located. For example, in the area where the flexible film 130 is located, the dam 690 is formed to protrude toward the conductive adhesive layer 628 so that a width may be increased as compared with a width in the area where the flexible film 130 is not located. Accordingly, when the flexible film 130 is attached, even though the conductive adhesive layer 628 is pressed, the overflowing of the conductive adhesive layer 628 at the end of the substrate 121 may be effectively suppressed.

The exemplary embodiments of the present disclosure can also be described as follows:

According to an aspect of the present disclosure, there is provided a display apparatus. The display apparatus includes a display panel having a substrate, a back cover which supports the display panel on one surface of the display panel, a flexible film which is electrically connected to a pad unit of the display panel, a sealing layer which covers one ends of the pad unit and the flexible film and a dam which is disposed at an end of the display panel in which the flexible film is located and is in contact with a rear surface of the flexible film.

The display device may further include a roller which winds or unwinds the display panel and the back cover.

The display device may further include a conductive adhesive layer disposed between the substrate and the flexible film.

The display panel may include a pixel unit disposed above the substrate, an encapsulation layer which seals the pixel unit and an encapsulation substrate disposed on the encapsulation layer.

The sealing layer may be disposed between the encapsulation layer and the dam.

The sealing layer may be disposed to cover side surfaces of the encapsulation layer and the encapsulation substrate and a part of an upper surface of the encapsulation substrate.

The dam may be configured by a first dam disposed at an end of the substrate where the flexible film is located and a second dam disposed to cover side surfaces of the first dam and the substrate.

The display device may further include an auxiliary dam disposed on the substrate between the encapsulation layer and the dam.

The dam may be configured by a material which configures a bank or a planarization layer when the bank or the planarization layer is formed in the pixel unit.

The dam may be disposed over an entire end of the display panel.

Side surfaces of the substrate and the dam may be exposed to an outside and the dam has different widths in an area where the flexible film is located and an area where the flexible film is not located.

The dam may be configured by a lower dam disposed on a rear surface of the flexible film, at an end of the substrate and an upper dam disposed on an upper surface of the flexible film.

The lower dam and the upper dam may be disposed to be opposite to each other.

The lower dam may be configured by a first lower dam disposed at an end of the substrate where the flexible film is located and a second lower dam disposed to cover side surfaces of the first lower dam and the substrate.

The rear surface and the upper surface of the flexible film may be in contact with the lower dam and the upper dam, respectively.

The display device may further include a getter provided in the dam.

The display device may further include a driving IC disposed on the rear surface of the flexible film, wherein the driving IC may be disposed at an outer edge of the dam.

The display device may further include a cover unit which is disposed on the other surface of the display panel to cover the flexible film.

The dam may be located between the back cover and the cover unit, in the pad unit.

A part of the dam may extend along a side surface of the display panel to be in contact with the cover unit.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
    a display panel having a substrate;
    a back cover that supports the display panel on one surface of the display panel;
    a flexible film that is electrically connected to a pad unit of the display panel;
    a sealing layer that covers one end of the pad unit and one end of the flexible film;
    a dam disposed at an end of the display panel in which the flexible film is located, the dam in contact with a rear surface of the flexible film; and
    a conductive adhesive layer that adheres the flexible film to the display panel, the conductive adhesive layer between the substrate and the flexible film and the conductive adhesive layer in contact with the rear surface of the flexible film.

2. The display device according to claim 1, further comprising:
    a roller that winds or unwinds the display panel and the back cover.

3. The display device according to claim 1, wherein the display panel includes:
    a pixel unit disposed above the substrate;
    an encapsulation layer that seals the pixel unit; and
    an encapsulation substrate disposed on the encapsulation layer.

4. The display device according to claim 3, wherein the sealing layer is disposed between the encapsulation layer and the dam.

5. The display device according to claim 3, wherein the sealing layer covers side surfaces of the encapsulation layer and the encapsulation substrate and a part of an upper surface of the encapsulation substrate.

6. The display device according to claim 3, wherein the dam comprises a material which configures a bank or a planarization layer when the bank or the planarization layer is formed in the pixel unit.

7. The display device according to claim 1, wherein the dam comprises:
    a first dam disposed at an end of the substrate where the flexible film is located; and
    a second dam covering side surfaces of the first dam and the substrate.

8. The display device according to claim 3, further comprising:
    an auxiliary dam disposed on the substrate between the encapsulation layer and the dam.

9. The display device according to claim 1, wherein the dam is disposed over an entire end of the display panel.

10. The display device according to claim 1, wherein side surfaces of the substrate and the dam are exposed to an outside and the dam has different widths in an area where the flexible film is located and an area where the flexible film is not located.

11. The display device according to claim 1, wherein the dam comprises:
    a lower dam disposed on a rear surface of the flexible film, at an end of the substrate; and
    an upper dam disposed on an upper surface of the flexible film.

12. The display device according to claim 11, wherein the lower dam and the upper dam are disposed opposite to each other.

13. The display device according to claim 11, wherein the lower dam comprises:
    a first lower dam disposed at an end of the substrate where the flexible film is located; and
    a second lower dam disposed to cover side surfaces of the first lower dam and the substrate.

14. The display device according to claim 11, wherein the rear surface and the upper surface of the flexible film are respectively in contact with the lower dam and the upper dam.

15. The display device according to claim 1, further comprising:
    a getter provided in the dam.

16. The display device according to claim 1, further comprising:
    a driving integrated circuit (IC) disposed on the rear surface of the flexible film,
    wherein the driving IC is disposed at an outer edge of the dam.

17. The display device according to claim 1, further comprising:

a cover unit disposed on another surface of the display panel to cover the flexible film.

18. The display device according to claim 17, wherein the dam is located between the back cover and the cover unit, in the pad unit.

19. The display device according to claim 17, wherein a part of the dam extends along a side surface of the display panel to be in contact with the cover unit.

* * * * *